US008218594B2

(12) United States Patent
Maeda et al.

(10) Patent No.: US 8,218,594 B2
(45) Date of Patent: Jul. 10, 2012

(54) VERTICAL CAVITY SURFACE EMITTING LASER

(75) Inventors: Osamu Maeda, Kanagawa (JP); Yuji Masui, Kanagawa (JP); Masaki Shiozaki, Kanagawa (JP); Takahiro Arakida, Kanagawa (JP); Takayuki Kawasumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 247 days.

(21) Appl. No.: 12/458,754

(22) Filed: Jul. 22, 2009

(65) Prior Publication Data
US 2010/0040104 A1   Feb. 18, 2010

(30) Foreign Application Priority Data

Aug. 14, 2008   (JP) .................................. 2008-209057

(51) Int. Cl.
H01S 5/00   (2006.01)
(52) U.S. Cl. ............... 372/45.01; 372/46.01; 372/50.11; 372/50.124; 372/98; 372/99
(58) Field of Classification Search ............... 372/45.01, 372/46.01, 50.124, 50.11, 98, 99
See application file for complete search history.

(56) References Cited

U.S. PATENT DOCUMENTS

| 6,215,805 | B1* | 4/2001 | Sartorius et al. ............. 372/50.1 |
| 6,556,607 | B1 | 4/2003 | Jewell |
| 6,687,280 | B1* | 2/2004 | Kajita ............................. 372/96 |
| 2007/0014324 | A1* | 1/2007 | Maeda et al. ............... 372/46.01 |
| 2008/0240194 | A1* | 10/2008 | Maeda et al. ................. 372/50.1 |
| 2008/0304532 | A1* | 12/2008 | Uchida ..................... 372/50.124 |
| 2009/0001386 | A1* | 1/2009 | Koda et al. ....................... 257/79 |
| 2009/0161714 | A1* | 6/2009 | Johnson et al. ............ 372/45.01 |

FOREIGN PATENT DOCUMENTS

| JP | 06-350192 A | 12/1994 |
| JP | 2000-332355 | 11/2000 |
| JP | 2006-210429 A | 8/2006 |

OTHER PUBLICATIONS

Japanese Office Action issued May 18, 2010 for corresponding Japanese Application No. 2008-209057.

* cited by examiner

Primary Examiner — Yuanda Zhang
(74) Attorney, Agent, or Firm — Rader Fishman & Grauer, PLLC

(57) ABSTRACT

The present invention provides a Vertical Cavity Surface Emitting Laser including: a first multilayer film reflector; an active layer having a light emission region; a second multilayer film reflector; and a reflectance adjustment layer in this order on a substrate side. The first multilayer film reflector and the second multilayer film reflector have a laminated structure in which reflectance of oscillation wavelength $\lambda_x$ is almost constant without depending on temperature change. The active layer is made of a material with which a maximum gain is obtained at temperature higher than ambient temperature. The reflectance adjustment layer has a laminated structure in which difference $\Delta R(=R_x-R_y)$ between reflectance $R_x$ of a region opposed to a central region of the light emission region and reflectance $R_y$ of a region opposed to an outer edge region of the light emission region is increased associated with temperature increase from ambient temperature to high temperature.

9 Claims, 6 Drawing Sheets

VERTICAL CAVITY SURFACE EMITTING LASER

BACKGROUND OF THE INVENTION

1. Field of the Invention

The present invention relates to a Vertical Cavity Surface Emitting Laser that includes a resonator structure radiating laser light from the top face.

2. Description of the Related Art

A Vertical Cavity Surface Emitting Laser radiates light in the direction perpendicular to the substrate differently from the existing Fabry-Perot resonator laser diodes. In the Vertical Cavity Surface Emitting Laser, many resonator structures are able to be arranged in a state of a two dimensional array on the same substrate. Therefore, the Vertical Cavity Surface Emitting Laser has recently attracted attention in the data communication field and the like.

Such a type of laser diode generally includes a resonator structure in the shape of a mesa in which a lower DBR layer, a lower spacer layer, an active layer, an upper spacer layer, an upper DBR layer, and a contact layer are layered in this order on a substrate. In one of the lower DBR layer and the upper DBR layer, to improve efficiency of current injection into the active layer and lower the threshold value current, a current confinement layer having a structure that a current injection region is confined is provided. Further, electrodes are respectively provided on the front face of the contact layer and the rear face of the substrate. In the laser diode, a current injected from the electrode is confined by the current confinement layer, and then injected into the active layer where light is emitted due to electron-hole recombination. The light is reflected by a pair of multilayer film reflectors, laser oscillation is generated in a given wavelength, and the light is radiated as laser light from the top face of the resonator structure.

In the foregoing laser diode, it is known that out of the laser light radiation region, basic transverse mode oscillation is generated mainly in the central region while high order transverse mode oscillation is generated mainly in the peripheral region. In the past, various technologies for inhibiting the high order transverse mode oscillation have been proposed. For example, in Japanese Unexamined Patent Application Publication No. 2000-332355, the following technology is disclosed. In the technology, a metal electrode having an aperture in the central region out of the laser light radiation region is provided, and reflectance in the metal electrode is decreased down to about 80% or less by alloying.

SUMMARY OF THE INVENTION

However, in the technology of Japanese Unexamined Patent Application Publication No. 2000-332355, since light absorption by the metal electrode is large, inhibition of the high order transverse mode oscillation and high output are hardly compatible. In reality, in the experimental result, the basic longitudinal mode oscillation is generated only up to a light output value slightly less than 3 mW at 25 deg C.

In view of such a disadvantage, in the invention, it is desirable to provide a Vertical Cavity Surface Emitting Laser capable of satisfying both inhibition of the high order transverse mode oscillation and high output.

According to an embodiment of the invention, there is provided a Vertical Cavity Surface Emitting Laser including on a substrate a first multilayer film reflector, an active layer having a light emission region, a second multilayer film reflector, and a reflectance adjustment layer in this order from the substrate side. The first multilayer film reflector and the second multilayer film reflector have a laminated structure in which reflectance of oscillation wavelength $\lambda_x$ is almost constant without depending on temperature change. The active layer is made of a material with which a maximum gain is obtained at temperature higher than ambient temperature. The reflectance adjustment layer has a laminated structure in which difference $\Delta R(=R_x-R_y)$ between reflectance $R_x$ in a region opposed to a central region of the light emission region and reflectance $R_y$ in a region opposed to an outer edge region of the light emission region is increased associated with temperature increase from ambient temperature to high temperature.

In the Vertical Cavity Surface Emitting Laser of the embodiment of the invention, in the reflectance adjustment layer provided on the second multilayer film reflector, the difference $\Delta R(=R_x-R_y)$ between the reflectance $R_x$ in the region opposed to the central region of the light emission region and the reflectance $R_y$ in the region opposed to the outer edge region of the light emission region is increased associated with temperature increase from ambient temperature to high temperature. Thereby, the high order transverse mode oscillation easily oscillated at high temperature due to thermal lens effect is able to be effectively inhibited at high temperature as well. Further due to the thermal lens effect, almost all of the basic transverse mode is distributed in the region opposed to the central region of the light emission region. Thus, the basic transverse mode is hardly affected by change of the reflectance $R_y$.

According to the Vertical Cavity Surface Emitting Laser of the embodiment of the invention, in the reflectance adjustment layer provided on the second multilayer film reflector, the difference $\Delta R$ is increased associated with temperature increase from ambient temperature to high temperature. Thus, while effect on light output of the basic transverse mode is kept to a minimum, the high order transverse mode oscillation is able to be effectively inhibited. Thus, both inhibition of the high order transverse mode oscillation and high output are able to be satisfied.

DETAILED DESCRIPTION OF THE PREFERRED EMBODIMENTS

Descriptions will be given of embodiments of the invention in detail with reference to the drawings.

First Embodiment

Figure 1:
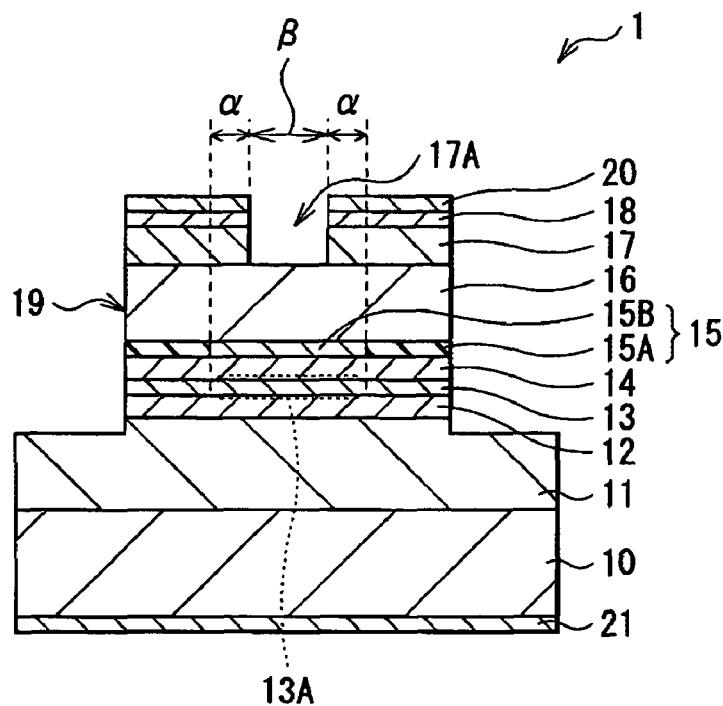
FIG. 1 is a cross sectional view of a Vertical Cavity Surface Emitting Laser according to a first embodiment of the invention.
Figure 2:
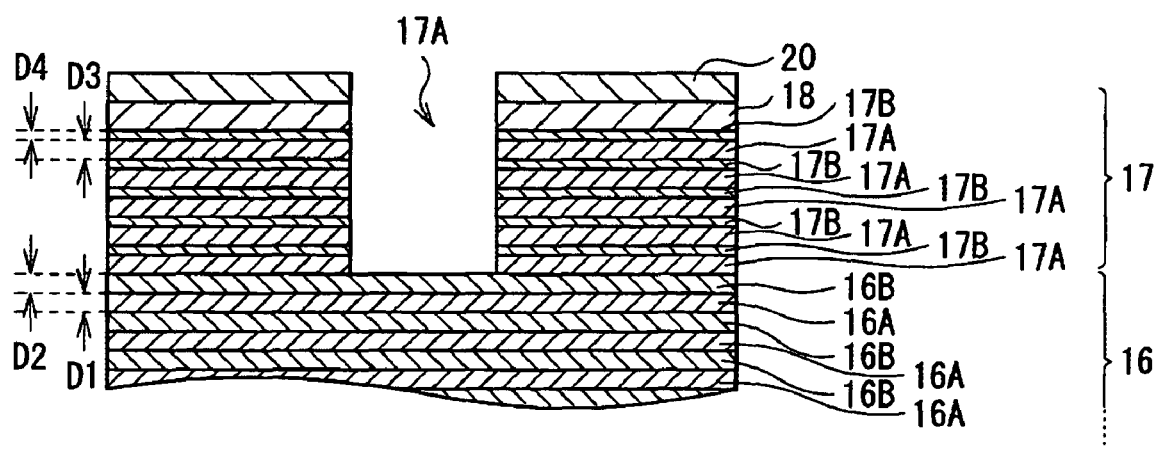
FIG. 2 is an enlarged cross sectional view of the temperature compensation DBR layer of FIG. 1 and the vicinity thereof.
Figure 3:
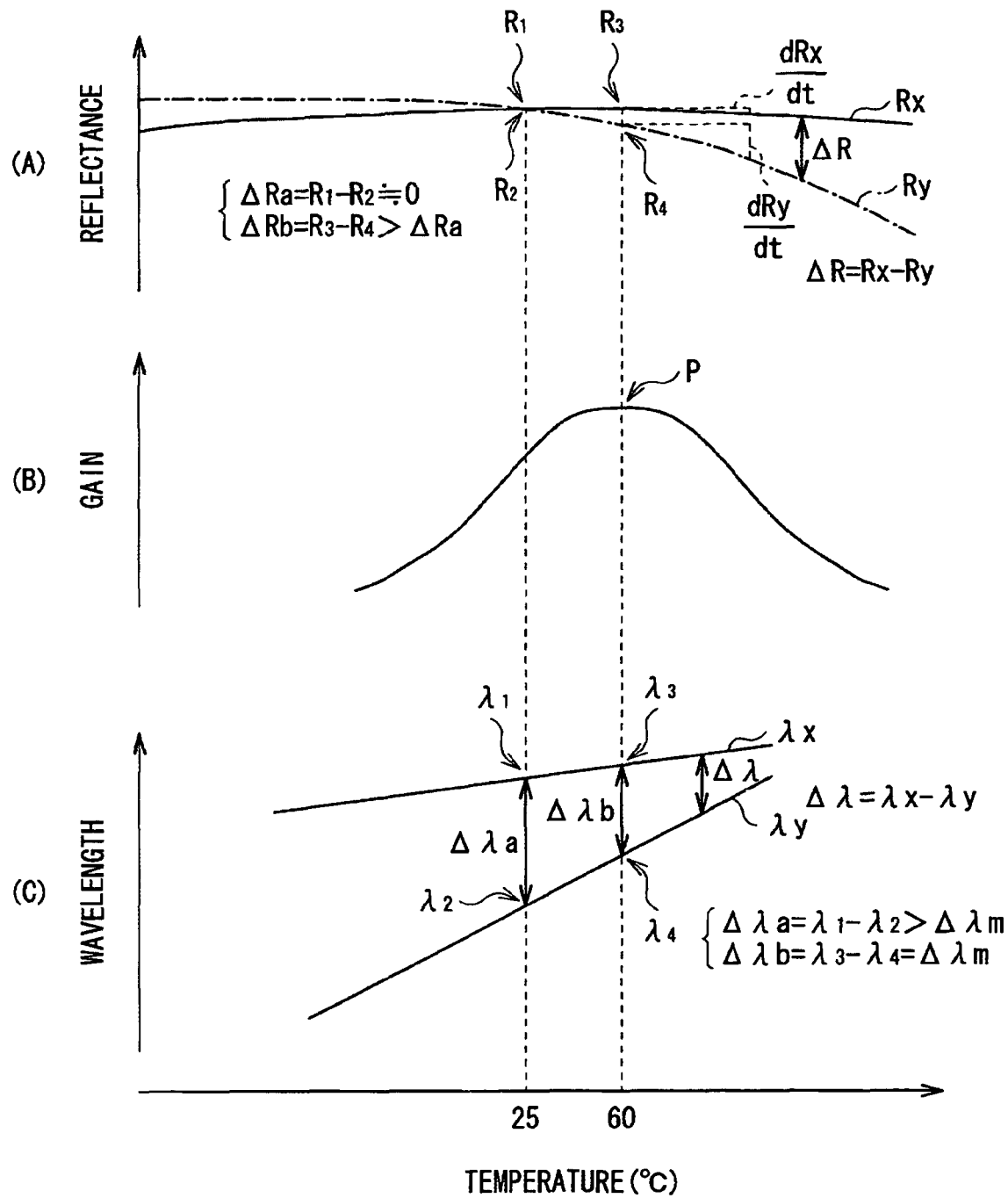
FIG. 3 is a characteristics diagram illustrating temperature dependence of reflectance, gain, and wavelength of the laser of FIG. 1.

FIG. 1 illustrates a cross sectional structure of a Vertical Cavity Surface Emitting Laser 1 according to a first embodiment of the invention. FIG. 2 is an enlarged part of the cross sectional structure of the Vertical Cavity Surface Emitting Laser 1 of FIG. 1. FIG. 1 and FIG. 2 are schematic views, and thus the dimensions and the shapes thereof are different from the actual dimensions and the actual shapes. (A) of FIG. 3 illustrates temperature dependence of reflectance of a temperature compensation DBR layer 17 described later. (B) of FIG. 3 illustrates temperature dependence of gain of the Vertical Cavity Surface Emitting Laser 1 of FIG. 1. (C) of FIG. 3 illustrates temperature dependence of oscillation wavelength $\lambda_x$ of the Vertical Cavity Surface Emitting Laser 1 and light emission wavelength $\lambda_y$ corresponding to bandgap of an active layer 13 described later.

The Vertical Cavity Surface Emitting Laser 1 includes, for example, a laminated structure in which a lower DBR layer 1, a lower spacer layer 12, the active layer 13, an upper spacer layer 14, a current confinement layer 15, an upper DBR layer 16, the temperature compensation DBR layer 17, and a contact layer 18 are layered in this order on one face side of a substrate 10. In the upper section of the laminated structure, specifically, in the upper section of the lower spacer layer 12, the active layer 13, the upper spacer layer 14, the current confinement layer 15, the upper DBR layer 16, the temperature compensation DBR layer 17, and the contact layer 18, a columnar mesa section 19 having a width of, for example, about 20 μm is formed.

In this embodiment, the lower DBR layer 11 corresponds to a specific example of "a first multilayer film reflector" of the invention, the upper DBR layer 16 corresponds to a specific example of "a second multilayer film reflector" of the invention, and the temperature compensation DBR layer 17 corresponds to a specific example of "a reflectance adjustment layer" or "a third multilayer film reflector" of the invention.

The substrate 10 is configured of, for example, n-type GaAs. Examples of n-type impurities include, for example, silicon (Si) and selenium (Se).

The lower DBR layer 11 has a laminated structure in which a low refractive index layer (first low refractive index layer) and a high refractive index layer (first high refractive index layer) are alternately layered. The low refractive index layer is configured of n-type $Al_{x1}Ga_{1-x1}As$ (0<x1<1) having a thickness of $\lambda_1/4n_1$, for example. The high refractive index layer is formed from n-type $Al_{x2}Ga_{1-x2}As$ (0≦x2<x1) having a thickness of $\lambda_1/4n_2$, for example. $n_1$ is a refractive index of the low refractive index layer. $n_2$ is a refractive index of the high refractive index layer, and is larger than $n_1$. $\lambda_1$ is an oscillation wavelength at 25 deg C. of the Vertical Cavity Surface Emitting Laser 1, and is larger than a light emission wavelength $\lambda_2$ corresponding to the bandgap at 25 deg C. of the active layer 13 (refer to (C) of FIG. 3).

The low refractive index layer and the high refractive index layer of the lower DBR layer 11 are not limited to the foregoing structures. For example, the low refractive index layer and the high refractive index layer of the lower DBR layer 11 may be configured of a plurality of layers while the optical thickness is kept at $\lambda_1/4$.

The lower spacer layer 12 is configured of, for example, n-type $Al_{x3}Ga_{1-x3}As$ (0≦x3<1). The upper spacer layer 14 is configured of, for example, p-type $Al_{x4}Ga_{1-x4}As$ (0≦x4<1). Examples of p-type impurity include, for example, zinc (Zn), magnesium (Mg), and beryllium (Be).

As illustrated in (B) of FIG. 3, the active layer 13 is made of a material with which the maximum gain is obtained at temperature higher than ambient temperature (25 deg C.) (for example, gain at the point indicated by P in (B) of FIG. 3). More specifically, the active layer 13 is made of a material with which difference $\Delta\lambda_a$ between the oscillation wavelength $\lambda_1$ at 25 deg C. and the light emission wavelength $\lambda_2$ corresponding to the bandgap at 25 deg C. of the active layer 13 ($=\lambda_1-\lambda_2$) is larger than $\Delta\lambda_m$ (difference between the oscillation wavelength $\lambda_x$ and the light emission wavelength $\lambda_y$ in the case of the maximum gain). For example, in the case where the active layer 13 is configured of undoped $Al_{x5}Ga_{1-x5}As$ (0≦x5<1), Al composition ratio x5 is a value larger than a value with which the maximum gain is obtained at 25 deg C.

A fluctuation amount with respect to temperature change of the oscillation wavelength $\lambda_x$ and a fluctuation amount with respect to temperature change of the light emission wavelength $\lambda_y$ are different from each other. The fluctuation amount with respect to temperature change of the light emission wavelength $\lambda_y$ is larger than the fluctuation amount with respect to temperature change of the oscillation wavelength $\lambda_x$. Thus, difference $\Delta\lambda$ between the oscillation wavelength $\lambda_x$ and the light emission wavelength $\lambda_y (=\lambda_x-\lambda_y)$ becomes smaller as temperature is increased. Therefore, in the case where the active layer 13 is made of a material with which $\Delta\lambda_a$ is larger than $\Delta\lambda_m$, temperature at which the difference $\Delta\lambda$ between the oscillation wavelength $\lambda_x$ and the light emission wavelength $\lambda_y$ becomes $\Delta\lambda_m$ is higher than 25 deg C. (C) of FIG. 3 exemplifies a case that the difference $\Delta\lambda_a$ at 25 deg C. is 20 nm (>$\Delta\lambda_m$), and difference $\Delta\lambda_b$ between oscillation wavelength $\lambda_3$ at 60 deg C. and light emission wavelength $\lambda_4$ corresponding to bandgap at 60 deg C. of the active layer 13 ($=\lambda_3-\lambda_4$) is 13 nm ($=\Delta\lambda_m$).

In general, it is known that in the case where the difference $\Delta\lambda$ between the oscillation wavelength $\lambda_x$ and the light emission wavelength $\lambda_y (<\lambda_x)$ corresponding to the bandgap of the active layer becomes a given size, the gain of the Vertical Cavity Surface Emitting Laser becomes the maximum value. For example, in the case where the active layer 13 is configured of $Al_{x5}Ga_{1-x5}As$, when $\Delta\lambda_m$ is 13 nm, the gain of the Vertical Cavity Surface Emitting Laser becomes the maximum value. Further, in the case where the active layer 13 is configured of an AlGaInP material in the wavelength range from 650 nm to 670 nm both inclusive, or InGaN material in the wavelength range of 400 nm, when $\Delta\lambda_m$ is 10 nm, the gain of the Vertical Cavity Surface Emitting Laser becomes the maximum value. Therefore, in the past, the material of the active layer and each thickness of each layer in the lower DBR layer 11 and the upper DBR layer 16 have been generally selected so that the difference $\Delta\lambda_a$ at ambient temperature becomes $\Delta\lambda_m$.

The oscillation wavelength $\lambda_x$ is able to be checked by measuring spectrum distribution of laser light radiated from the Vertical Cavity Surface Emitting Laser 1. Further, the light emission wavelength $\lambda_y$ is able to be checked by removing, for example, the substrate 10 and the lower DBR layer 11 from the Vertical Cavity Surface Emitting Laser 1, exposing the lower spacer layer 12, irradiating the lower spacer layer 12 with given laser light, and measuring spectrum distribution of light emitted from the active layer 13.

The current confinement layer 15 has a current confinement region 15A in a region with a given depth from the side face of the mesa section 19, and has a current injection region 15B in the region other than the current confinement region 15A (central region of the mesa section 19). The current injection region 15B is configured of, for example, p-type $Al_{x6}Ga_{1-x6}As$ (0<x6≦1). The current confinement region 15A contains, for example, $Al_2O_3$ (aluminum oxide). The current confinement region 15A is formed by oxidizing highly concentrated Al contained in an oxidized layer (not illustrated) from the side face of the mesa section 19. Therefore, out of the active layer 13, the region opposed to the current injection region 15B corresponds to the current injection region of the active layer 13, that is, a light emission region 13A.

The current confinement layer 15 is not necessarily provided between the upper spacer layer 14 and the upper DBR layer 16. For example, though not illustrated, the current confinement layer 15 may be provided in a region of a low refractive index layer 16A apart from the active layer 13 side by several layers in the upper DBR layer 16 instead of the low refractive index layer 16A.

For example, as illustrated in FIG. 2, the upper DBR layer 16 has a laminated structure in which the low refractive index layer 16A (second low refractive index layer) and a high refractive index layer 16B (second high refractive index layer) are alternately layered. The upper DBR layer 16 has the high refractive index layer 16B on the uppermost layer. The low refractive index layer 16A is configured of p-type $Al_{x7}Ga_{1-x7}As$ (0<x7<1) having a thickness D1 of $\lambda_1/4n_3$, for example. The high refractive index layer 16B is configured of p-type $Al_{x8}Ga_{1-x8}As$ (0≦x8<x7) having a thickness D2 of $\lambda_1/4n_4$, for example. $n_3$ is a refractive index of the low refractive index layer. $n_4$ is a refractive index of the high refractive index layer, and is larger than $n_3$.

The low refractive index layer 16A and the high refractive index layer 16B in the upper DBR layer 16 are not limited to the foregoing structures. For example, the low refractive index layer 16A and the high refractive index layer 16B may be configured of a plurality of layers while the optical thickness is kept at $\lambda_1/4$.

The temperature compensation DBR layer 17 has a laminated structure in which reflectance in a given wavelength range including the oscillation wavelength $\lambda_x$ and the light emission wavelength $\lambda_y$ corresponding to the bandgap of the active layer 13 is decreased as the wavelength is longer. The temperature compensation DBR layer 17 has a laminated structure having periodicity different from periodicity of the lower DBR layer 11 and the upper DBR layer 16. For example, the temperature compensation DBR layer 17 is formed by alternately layering a low refractive index layer 17A (third low refractive index layer) and a high refractive index layer 17B (third high refractive index layer). The low refractive index layer 17A is configured of p-type $Al_{x9}Ga_{1-x9}As$ (0<x9<1) having a thickness D3 of $\lambda_1/4n_5$, for example. The high refractive index layer 17B is configured of p-type $Al_{x10}Ga_{1-x10}As$ (0≦x10<x9) having a thickness D4 smaller than $\lambda_1/4n_6$, for example. $n_5$ is a refractive index of the low refractive index layer. $n_6$ is a refractive index of the high refractive index layer, and is larger than $n_5$. The thickness D4 of the high refractive index layer 17B is a value with which the reflectance becomes lower than reflectance in the case where the temperature compensation DBR layer 17 is not provided on the upper DBR layer 16.

The low refractive index layer 17A and the high refractive index layer 17B in the temperature compensation DBR layer 17 are not limited to the foregoing structures. For example, the low refractive index layer 17A may be configured of a plurality of layers while the optical thickness is kept at $\lambda_1/4$. The high refractive index layer 17B may be configured of a plurality of layers while the optical thickness is kept at a given thickness smaller than $\lambda_1/4$.

In this embodiment, the temperature compensation DBR layer 17 is provided at least in the region opposed to the outer edge region of the light emission region 13A and in the region excluding the region opposed to the central region of the light emission region 13A. The temperature compensation DBR layer 17 is circular viewed in the lamination direction of the Vertical Cavity Surface Emitting Laser 1. FIG. 1 and FIG. 2 exemplify a case that the temperature compensation DBR layer 17 is provided not only in the region opposed to the outer edge region of the light emission region 13A, but also in the region opposed to the outer circumference thereof.

In the region opposed to the central region of the light emission region 13A, an aperture 17A is provided. The uppermost surface of the upper DBR layer 16 (high refractive index layer 16B) is exposed on the bottom face of the aperture 17A. In the case where the Vertical Cavity Surface Emitting Laser 1 is viewed in the lamination direction, the region corresponding to the aperture 17A does not include the temperature compensation DBR layer 17, and thus the region corresponding to the aperture 17A is high reflecting area β. The region corresponding to the peripheral edge of the aperture 17A (region corresponding to the light emission region 13A out of the temperature compensation DBR layer 17) includes the temperature compensation DBR layer 17, and thus the region corresponding to the peripheral edge of the aperture 17A is low reflecting area α.

As illustrated in (A) of FIG. 3, reflectance $R_x$ of the high reflecting area β is almost constant without depending on temperature change, which results from the fact that the lower DBR layer 11 and the upper DBR layer 16 have periodicity of optical thickness $\lambda_1/4$. Further, as illustrated in (A) of FIG. 3, reflectance $R_y$ of the low reflecting area α becomes smaller associated with temperature increase from ambient temperature to high temperature, which results from the fact that the temperature compensation DBR layer 17 does not have periodicity of optical thickness $\lambda_1/4$. If the reflectance $R_x$ is compared to the reflectance $R_y$, it is found that difference ΔR between the reflectance $R_x$ and the reflectance $R_y$(=$R_x$−$R_y$) is increased associated with temperature increase from ambient temperature to high temperature. Further, it is found that reduction rate ($dR_y/d_t$) associated with temperature increase from ambient temperature to high temperature, of the reflectance $R_y$, is larger than reduction rate ($dR_x/d_t$) associated with temperature increase from ambient temperature to high temperature, of the reflectance $R_x$. Therefore, it is found that as illustrated in (A) of FIG. 3, the difference ΔR between the reflectance $R_x$ of the high reflecting area β and the reflectance $R_y$ of the low reflecting area α(=$R_x$−$R_y$) is increased associated with temperature increase from ambient temperature to high temperature.

The contact layer 18 is configured of, for example, p-type $Al_{x11}Ga_{1-x11}As$ (0≦x11<1).

Further, in the Vertical Cavity Surface Emitting Laser 1, an upper electrode 20 is formed on the top face of the mesa section 19 (contact layer 18). The upper electrode 20 is in the shape of a ring having an aperture at least in the region opposed to the high reflecting area P. On the rear face of the substrate 10, a lower electrode 21 is formed.

The upper electrode 20 has a structure in which, for example, titanium (Ti), platinum (Pt), and gold (Au) are layered in this order from the substrate 10 side. The upper electrode 20 is electrically connected to the contact layer 18. The lower electrode 21 has a structure in which, for example, an alloy of gold (Au) and germanium (Ge), nickel (Ni), and gold (Au) are layered in this order from the substrate 10 side. The lower electrode 21 is electrically connected to the substrate 10.

The Vertical Cavity Surface Emitting Laser 1 according to this embodiment is able to be manufactured, for example, as follows.

For example, to manufacture a GaAs Vertical Cavity Surface Emitting Laser, the laminated structure on the substrate 10 is formed by epitaxial-crystal grown with the use of, for example, MBE (Molecular Beam Epitaxy) method and MOCVD (Metal Organic Chemical Vapor Deposition) method. At this time, as a raw material of GaAs compound semiconductor, for example, trimethyl aluminum (TMA), trimethyl gallium (TMG), trimethyl indium (TMIn), and arsine ($AsH_3$) are used. As a raw material of donor impurity, for example, $H_2Se$ is used. As a raw material of acceptor impurity, for example, dimethyl zinc (DMZ) is used.

First, the lower DBR layer 11, the lower spacer layer 12, the active layer 13, the upper spacer layer 14, the oxidized layer (not illustrated), the upper DBR layer 16, the temperature compensation layer 17, and the contact layer 18 are layered over the substrate 10 in this order.

Next, a resist layer having an aperture in the region corresponding to the high reflecting area β is formed on the contact layer 18. Subsequently, with the use of the resist layer as a mask, the section from the contact layer 18 to the temperature compensation DBR layer 17 is selectively etched by, for example, wet etching method to form the aperture 17A. After that, the resist layer is removed.

Next, a circular resist layer is formed in a given region including the aperture 17A. Subsequently, with the use of the resist layer as a mask, from the contact layer 18 to part of the lower DBR layer 11 are selectively etched by, for example, RIE (Reactive Ion Etching) method to form the mesa section 19. After that, the resist layer is removed.

Next, oxidation treatment is performed at high temperature in the water vapor atmosphere to selectively oxidize Al of the oxidized layer from the side face of the mesa section 19. Thereby, the peripheral region of the oxidized layer becomes the current confinement region 15A, and the central region becomes the current injection region 15B.

Next, for example, by evaporation method, the upper electrode 20 is formed on the contact layer 18, and the lower electrode 21 is formed on the rear face side of the substrate 10. Consequently, the Vertical Cavity Surface Emitting Laser 1 of this embodiment is manufactured.

Next, a description will be given of action and effect of the Vertical Cavity Surface Emitting Laser 1 of this embodiment.

In the Vertical Cavity Surface Emitting Laser 1 of this embodiment, in the case where a given voltage is applied to between the upper electrode 20 and the lower electrode 21, a current confined by the current confinement layer 15 is injected into the active layer 13, and thereby light due to electron-hole recombination is generated. Such light is reflected by the pair of the lower DBR layer 11 and the upper DBR layer 16. Laser oscillation is generated at a given wavelength, and the light is radiated as a laser beam outside.

In general, in the Vertical Cavity Surface Emitting Laser, it is known that out of the laser light radiation region, basic transverse mode oscillation is generated mainly in the central region, while high order transverse mode oscillation is generated mainly in the peripheral region. In the past, various technologies for inhibiting the high order transverse mode oscillation have been proposed. For example, a method in which a metal electrode having an aperture only in the central region out of the laser light radiation region is provided, and reflectance in the metal electrode is decreased down to about 80% or less by alloying has been proposed.

However, in such a method, since light absorption by the metal electrode is large, inhibition of the high order transverse mode oscillation and high output are hardly compatible. In reality, in the experimental result, basic longitudinal mode oscillation is generated only up to a light output value slightly less than 3 mW at 25 deg C.

Meanwhile, in this embodiment, the temperature compensation DBR layer 17 is provided on the upper DBR layer 16, at least in the region opposed to the outer edge region of the light emission region 13A, and in the region excluding the region opposed to the central region of the light emission region 13A. In the region opposed to the central region of the light emission region 13A, the aperture 17A is provided. The difference $\Delta R(=R_x-R_y)$ between the reflectance $R_x$ of the high reflecting area P and the reflectance $R_y$ of the low reflecting area α is increased associated with temperature increase from ambient temperature to high temperature.

Thereby, even in the case where due to thermal lens effect, the profile of the high order transverse mode is shifted from the outer edge region of the light emitting region 13A to the central region of the light emitting region 13A and the high order transverse mode oscillation is easily generated, the high order transverse mode oscillation is able to be effectively inhibited at high temperature as well.

Figure 4:
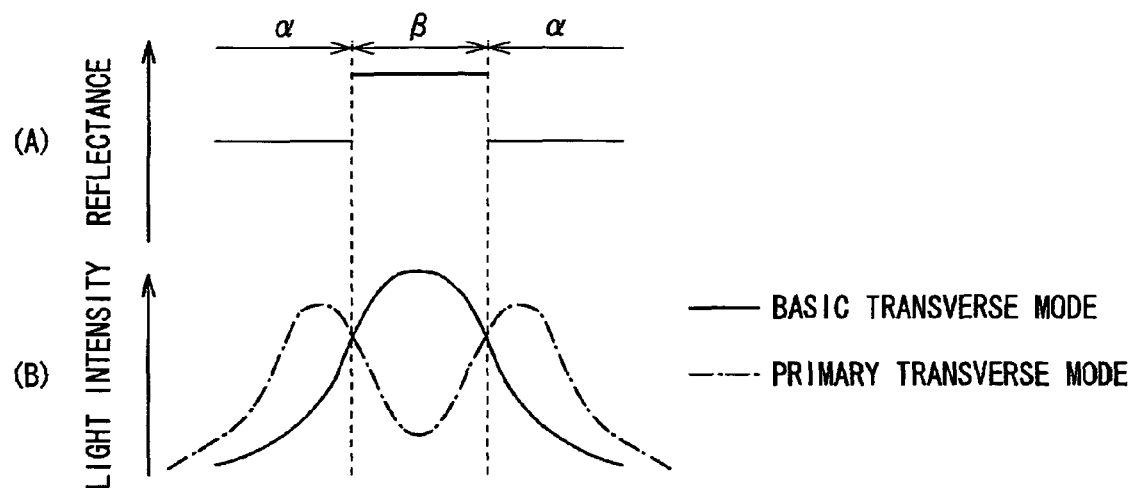
FIG. 4 is a relation diagram illustrating a relation between reflectance distribution and light intensity at 25 deg C. of the laser of FIG. 1.
Figure 5:
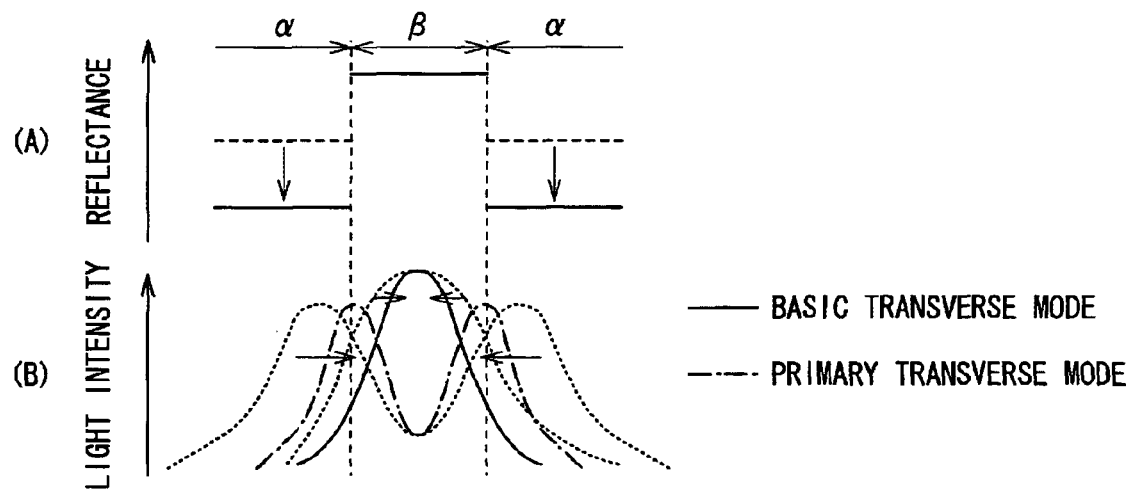
FIG. 5 is a relation diagram illustrating a relation between reflectance distribution and light intensity at 60 deg C. of the laser of FIG. 1.

(A) of FIG. 4 illustrates an example of a relation between the reflectance $R_x$ of the high reflecting area β and the reflectance $R_y$ of the low reflecting area α at ambient temperature. (B) of FIG. 4 illustrates an example of profiles of the basic transverse mode and primary transverse mode at ambient temperature. (A) of FIG. 5 illustrates an example of a relation between the reflectance $R_x$ of the high reflecting area β and the reflectance $R_y$ of the low reflecting area α at high temperature, and a state of change of the reflectance $R_x$ and the reflectance $R_y$ when temperature is changed from ambient temperature to high temperature. (B) of FIG. 5 illustrates an example of profiles of the basic transverse mode and the primary transverse mode at high temperature, and a state of change of the profiles of the basic transverse mode and the primary transverse mode.

Based on (A) and (B) of FIG. 4 and (A) and (B) of FIG. 5, it is found that the peak position of the primary transverse mode is shifted to the position in the vicinity of the boundary between the low reflecting area α and the high reflecting area β, as temperature is changed from ambient temperature to high temperature. However, in this embodiment, it is found that since the reflectance $R_y$ of the low reflecting area α is largely decreased as temperature is changed from ambient temperature to high temperature, inhibition of the primary transverse mode oscillation is maintained.

Further, based on (A) and (B) of FIG. 4 and (A) and (B) of FIG. 5, it is found that almost all of the basic transverse mode is distributed in the high reflecting area β as temperature is changed from ambient temperature to high temperature. Thus, even if the reflectance $R_y$ of the low reflecting area α is largely decreased, the basic transverse mode is hardly affected thereby. Accordingly, due to the high reflectance of the high reflecting area β, the basic transverse mode oscillation is enabled on high output.

As described above, in this embodiment, while effect on light output of the basic transverse mode is kept to a minimum, the high order transverse mode oscillation is able to be effectively inhibited. Thus, both inhibition of the high order transverse mode oscillation and high output are able to be satisfied.

Further, in the general Vertical Cavity Surface Emitting Laser, in the past, a material of the active layer and each thickness of each layer in the lower DBR layer 11 and the upper DBR layer 16 have been generally selected so that the difference $\Delta\lambda_a$ at ambient temperature becomes $\Delta\lambda_m$ (difference between the oscillation wavelength $\lambda_x$ and the light emission wavelength $\lambda_y$ in the case of the maximum gain). Thus, since the difference $\Delta\lambda_b$ at high temperature is smaller than $\Delta\lambda_m$, as indicated by the dotted line in FIG. 6, the threshold current is increased at high temperature (60 deg C.).

Meanwhile, in this embodiment, the active layer 13 is made of the material with which the difference $\Delta\lambda_a$ between the oscillation wavelength $\lambda_1$ at 25 deg C. and the light emission wavelength $\lambda_2$ corresponding to the bandgap at 25 deg C. of the active layer 13 ($=\lambda_1-\lambda_2$) is larger than $\Delta\lambda_m$. Thereby, as illustrated in (C) of FIG. 3, the temperature at which the difference $\Delta\lambda$ between the oscillation wavelength $\lambda_x$ and the light emission wavelength $\lambda_y$ becomes $\Delta\lambda_m$ is higher than 25 deg C. Thus, by driving the Vertical Cavity Surface Emitting Laser 1 at the temperature at which the difference $\Delta\lambda$ becomes $\Delta\lambda_m$ (in (C) of FIG. 3, 60 deg C.), that is, at the temperature at which the gain of the Vertical Cavity Surface Emitting Laser 1 becomes maximum, the threshold current is able to be minimized. In result, as indicated by the dashed line in FIG. 6, the threshold current is able to be decreased at high temperature (60 deg C.).

Figure 6:
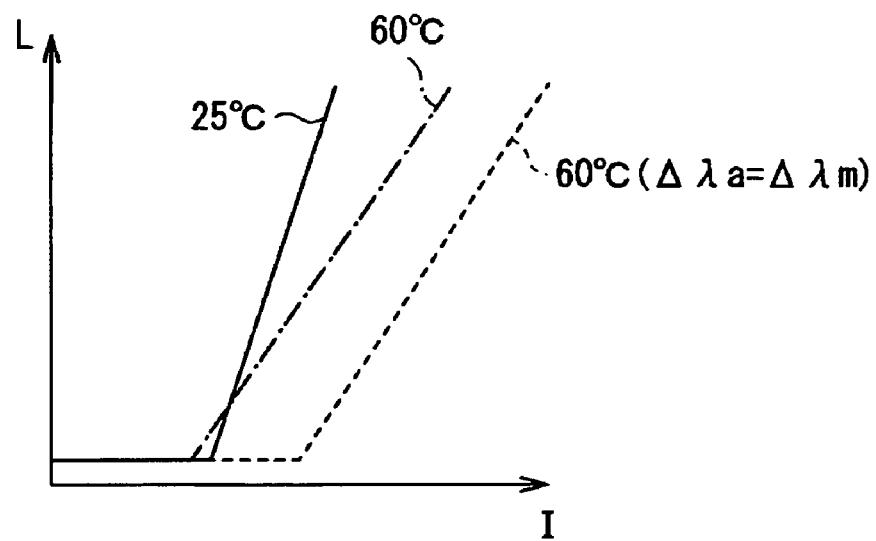
FIG. 6 is a characteristics diagram illustrating I-L characteristics of the laser of FIG. 1.

In the Vertical Cavity Surface Emitting Laser 1 of this embodiment, however, as in the general Vertical Cavity Surface Emitting Laser, slope efficiency is decreased due to high temperature as illustrated in FIG. 6.

Second Embodiment

Figure 7:
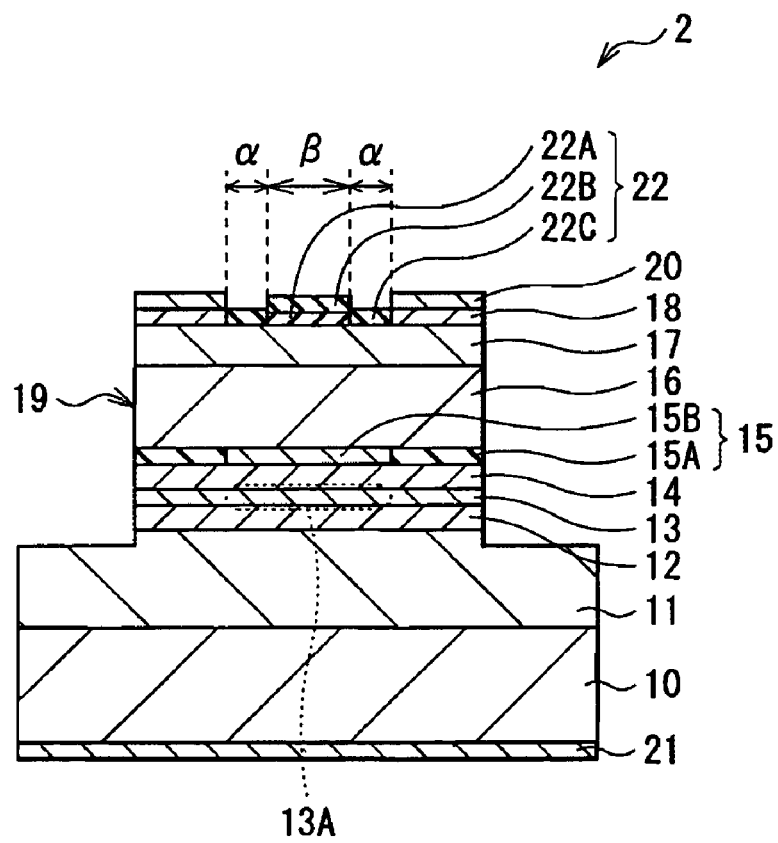
FIG. 7 is a cross sectional view of a Vertical Cavity Surface Emitting Laser according to a second embodiment of the invention.
Figure 8:
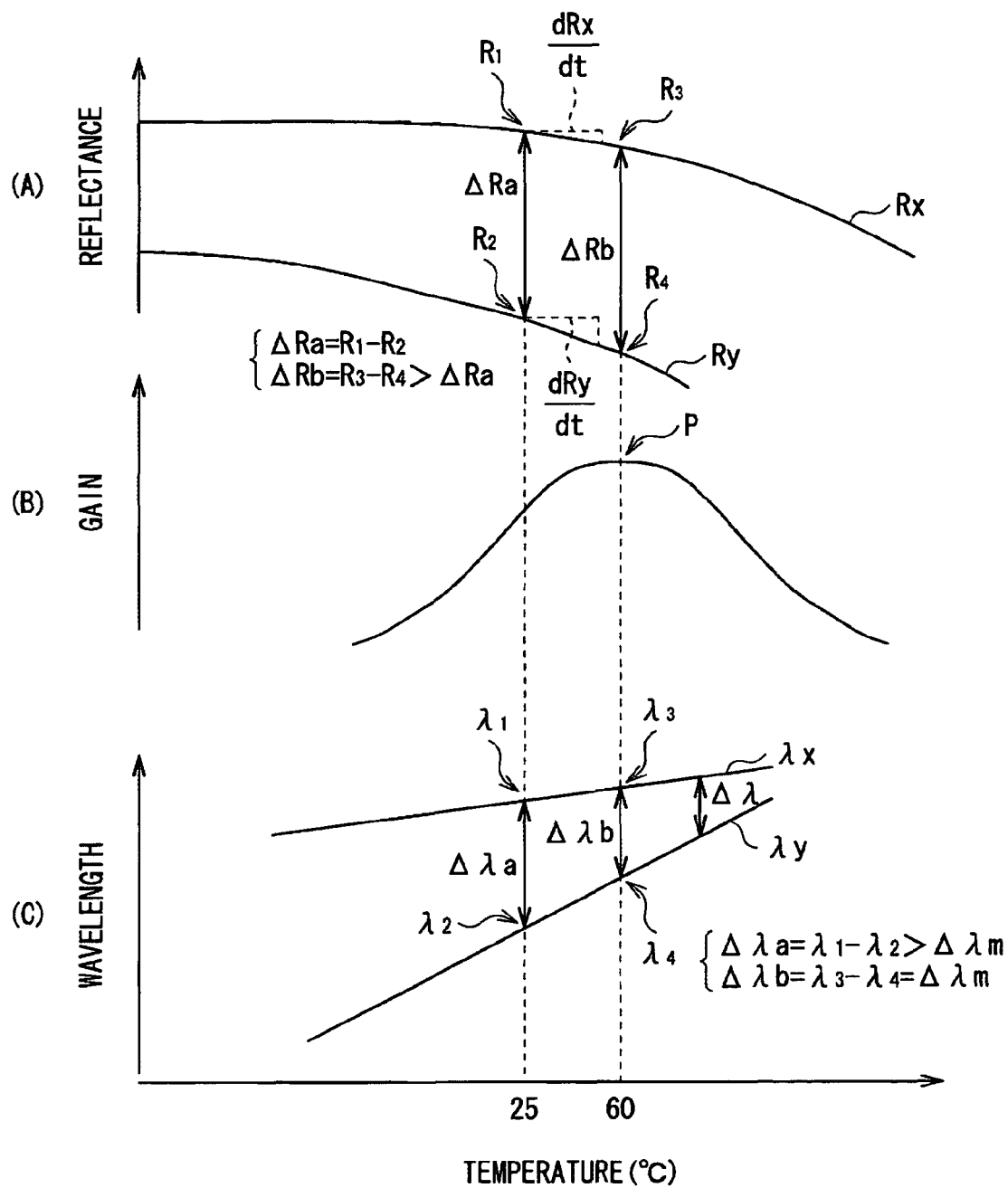
FIG. 8 is a characteristics diagram illustrating temperature dependence of reflectance, gain, and wavelength of the laser of FIG. 7.

FIG. 7 illustrates a cross sectional structure of a Vertical Cavity Surface Emitting Laser 2 according to a second embodiment of the invention. FIG. 7 is a schematic view, and thus the dimensions and the shapes thereof are different from the actual dimensions and the actual shapes. (A) of FIG. 8 illustrates temperature dependence of reflectance of a laminated structure (reflectance adjustment layer) configured of the temperature compensation DBR layer 17 and a transverse mode adjustment layer 22 described later. (B) of FIG. 8 illustrates temperature dependence of gain of the Vertical Cavity Surface Emitting Laser 2. (C) of FIG. 8 illustrates temperature dependence of the oscillation wavelength λx and the light emission wavelength λy.

The Vertical Cavity Surface Emitting Laser 2 of this embodiment is different from the structure of the Vertical Cavity Surface Emitting Laser 1 of the foregoing embodiment in that the Vertical Cavity Surface Emitting Laser 2 includes the temperature compensation DBR layer 17 at least in the whole region opposed to the light emission region 13A, and does not include the aperture 17A. Further, the Vertical Cavity Surface Emitting Laser 2 is different from the structure of the Vertical Cavity Surface Emitting Laser 1 of the foregoing embodiment in that the Vertical Cavity Surface Emitting Laser 2 further includes the transverse mode adjustment layer 22 on the temperature compensation DBR layer 17, and in the whole region opposed to the light emission region 13A. Thus, a description will be hereinafter given of points different from the foregoing embodiment, and descriptions of the points common to the foregoing embodiment will be omitted as appropriate.

The transverse mode adjustment layer 22 has a laminated structure in which the reflectance $R_y$ of the low reflecting area α is lower than the reflectance $R_x$ of the high reflecting area β in a given wavelength ($\lambda_3$) larger than the oscillation wavelength $\lambda_1$ at 25 deg C. The transverse mode adjustment layer 22 is provided being contacted with the uppermost surface of the upper DBR layer 16 (high refractive index layer 16B). The transverse mode adjustment layer 22 has a laminated structure having periodicity different from periodicity of the lower DBR layer 11 and the upper DBR layer 16. The transverse mode adjustment layer 22 has a structure in which, for example, a first adjustment layer 22A and a second adjustment layer 22B are layered in this order from the upper DBR layer 16 side in the high reflecting area β, and has a structure including a third adjustment layer 22C in the low reflecting area α.

The first adjustment layer 22A is configured of a material having a thickness of $(2k-1)\lambda_1/4n_7$, in which the refractive index $n_7$ has a value lower than the refractive index of the uppermost surface of the upper DBR layer 16 (high refractive index layer 16B), for example, a dielectric body such as $SiO_2$ (silicon oxide). The second adjustment layer 22B is configured of a material having a thickness larger than $(2m-1)\lambda_1/4n_8$, in which the refractive index $n_8$ has a value higher than the refractive index $n_7$ of the first adjustment layer 22A, for example, a dielectric body such as SiN (silicon nitride). The third adjustment layer 22C is configured of a material having a thickness of $(2n-1)\lambda_1/4n_9$, in which the refractive index $n_9$ has a value higher than the refractive index $n_7$ of the first adjustment layer 22A, for example, a dielectric body such as SiN (silicon nitride).

k, m, and n are respectively an integer number of 1 or more. $n_7$ is the refractive index of the first adjustment layer 22A. $n_8$ is the refractive index of the second adjustment layer 22B. $n_9$ is the refractive index of the third adjustment layer 22C.

The second adjustment layer 22B and the third adjustment layer 22C preferably have the same film thickness and are preferably made of the same material. In this case, in the manufacturing process, the second adjustment layer 22B and the third adjustment layer 22C are able to be formed in block, and the manufacturing steps are able to be simplified.

Figure 9:
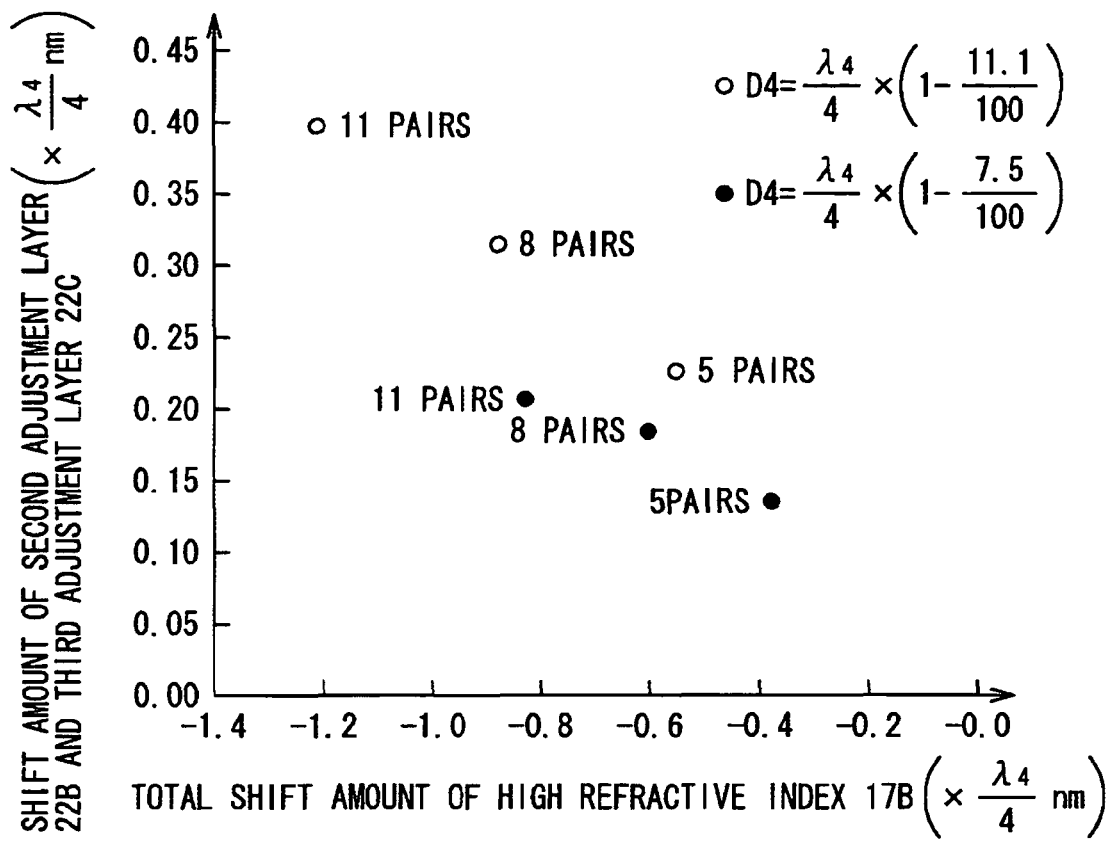
FIG. 9 is a relation diagram illustrating a relation between a total shift amount of a high refractive index layer in the temperature compensation DBR layer and a shift amount of a second (third) adjustment layer.

Periodicity shift from the optical thickness $\lambda_1/4$ in the second adjustment layer 22B and the third adjustment layer 22C compensates periodicity shift from the optical thickness $\lambda_1/4$ in the temperature compensation DBR layer 17. For example, as illustrated in FIG. 9, since the total shift amount of the high refractive index layer 17B in the temperature compensation DBR layer 17 is increased in the minus direction as the number of pairs of the high refractive index layer 17B is increased, the shift amount of the second adjustment layer 22B and the third adjustment layer 22C is increased in the plus direction as the number of pairs of the high refractive index layer 17B is increased. Further, as illustrated in FIG. 9, since the total shift amount of the high refractive index layer 17B in the temperature compensation DBR layer 17 is increased in the minus direction as the shift amount of the single high refractive index layer 17B is increased, the shift amount of the second adjustment layer 22B and the third adjustment layer 22C is increased in the plus direction as the shift amount of the single high refractive index layer 17B is increased.

By compensating periodicity shift of the temperature compensation DBR layer 17 by the second adjustment layer 22B and the third adjustment layer 22C as described above, the laminated structure configured of the first adjustment layer 22A and the second adjustment layer 22B has a function to reflect light from the active layer 13 at high reflectance, and becomes a high reflectance region in the transverse mode adjustment layer 22. Meanwhile, the third adjustment layer 22C has a function to reflect light from the active layer 13 at reflectance lower than that of the laminated structure configured of the first adjustment layer 22A and the second adjustment layer 22B, and becomes a low reflectance region in the transverse mode adjustment layer 22.

Next, a description will be given of action and effect of the Vertical Cavity Surface Emitting Laser 2 of this embodiment.

In this embodiment, the temperature compensation DBR layer 17 is provided on the upper DBR layer 16 and at least in the region opposed to the light emission region 13A. The transverse mode adjustment layer 22 is provided on the temperature compensation DBR layer 17 and at least in the region opposed to the light emission region 13A. Due to the temperature compensation DBR layer 17, both the reflectance $R_x$ of the high reflecting area β and the reflectance $R_y$ of the low reflecting area α are decreased associated with temperature increase from ambient temperature to high temperature. Further, due to the transverse mode adjustment layer 22, in a given wavelength ($λ_3$) larger than the oscillation wavelength $λ_1$ at 25 deg C., the reflectance $R_y$ of the low reflecting area α is lower than the reflectance $R_x$ of the high reflecting area β.

Accordingly, as illustrated in (A) of FIG. 8, in the laminated structure configured of the temperature compensation DBR layer 17 and the transverse mode adjustment layer 22, the reflectance $R_x$ and the reflectance $R_y$ are decreased associated with temperature increase from ambient temperature to high temperature. Further, reduction rate ($dR_y/d_t$) associated with temperature increase from ambient temperature to high temperature of the reflectance $R_y$ is larger than reduction rate ($dR_x/d_t$) associated with temperature increase from ambient temperature to high temperature of the reflectance $R_x$. Therefore, in the laminated structure configured of the temperature compensation DBR layer 17 and the transverse mode adjustment layer 22, the difference $ΔR(=R_x-R_y)$ between the reflectance $R_x$ of the high reflecting area β and the reflectance $R_y$ of the low reflecting area α is increased associated with temperature increase from ambient temperature to high temperature.

Thereby, even in the case where due to thermal lens effect, the profile of the high order transverse mode is shifted from the outer edge region of the light emission region 13A to the central region of the light emission region 13A and the high order transverse mode oscillation is easily generated, the high order transverse mode oscillation is able to be effectively inhibited at high temperature as well. Further, as explained with reference to (A) and (B) of FIG. 4 and (A) and (B) of FIG. 5 in the foregoing embodiment, in this embodiment, while effect on light output of the basic transverse mode is kept to a minimum, the high order transverse mode oscillation is able to be effectively inhibited as well. Thus, both inhibition of the high order transverse mode oscillation and high output are able to be satisfied.

Figure 10:
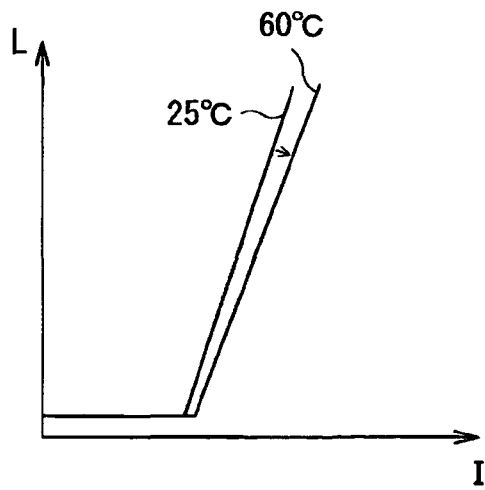
FIG. 10 is a characteristics diagram illustrating I-L characteristics of the laser of FIG. 7.

Further, in this embodiment, as in the foregoing embodiment, the active layer 13 is made of the material with which the difference $Δλ_a$ between the oscillation wavelength $λ_1$ at 25 deg C. and the light emission wavelength $λ_2$ corresponding to the bandgap at 25 deg C. of the active layer 13 ($=λ_1-λ_2$) is larger than $Δλ_m$. Thereby, as illustrated in (C) of FIG. 8, the temperature at which the difference Δλ between the oscillation wavelength $λ_x$ and the light emission wavelength $λ_y$ becomes $Δλ_m$ is higher than 25 deg C. Thus, by driving the Vertical Cavity Surface Emitting Laser 2 at the temperature at which the difference Δλ becomes $Δλ_m$ (60 deg C. in (C) of FIG. 8) that is, at the temperature at which the gain of the Vertical Cavity Surface Emitting Laser 2 becomes maximum, the threshold current is able to be minimized. In result, as illustrated in FIG. 10, the threshold current is able to be decreased at high temperature (60 deg C.).

Further, in this embodiment, the temperature compensation DBR layer 17 is provided in the region opposed to the central region of the light emission region 13A as well. Thus, the reflectance $R_x$ of the region opposed to the central region of the light emission region 13A (high reflecting area β) is decreased associated with temperature increase from ambient temperature to high temperature. Thereby, lowering of slope efficiency associated with temperature increase is able to be prevented. Thus, as illustrated in FIG. 10, it is able to mostly prevent slope efficiency at ambient temperature (25 deg C.) from being changed at high temperature (60 deg C.).

It should be understood by those skilled in the art that various modifications, combinations, sub-combinations and alterations may occur depending on design requirements and other factors insofar as they are within the scope of the appended claims or the equivalents thereof.

For example, in the foregoing embodiments, the description has been given of the case that as a semiconductor material, the AlGaAs compound semiconductor is used. However, as a semiconductor material, other material such as a GaInP (infrared) material, AlGaAs (red), GaN (blue green) and the like are able to be used.

The present application contains subject matter related to that disclosed in Japanese Priority Patent Application JP 2008-209057 filed in the Japan Patent Office on Aug. 14, 2008, the entire content of which is hereby incorporated by reference.

What is claimed is:

1. A Vertical Cavity Surface Emitting Laser comprising on a substrate:
   a first multilayer film reflector;
   an active layer having a light emission region;
   a second multilayer film reflector; and
   a reflectance adjustment layer in this order from the substrate side, wherein
   the first multilayer film reflector and the second multilayer film reflector have a laminated structure in which reflectance of oscillation wavelength $λ_x$ is almost constant without depending on temperature change,
   the active layer is made of a material with which a maximum gain is obtained at a temperature higher than an ambient temperature, and
   the reflectance adjustment layer has a laminated structure in which difference $ΔR (=R_x-R_y)$ between reflectance $R_x$ of a region opposed to a central region of the light emission region and reflectance $R_y$ of a region opposed to an outer edge region of the light emission region is increased associated with temperature increase from the ambient temperature to a high temperature.

2. The Vertical Cavity Surface Emitting Laser according to claim 1, wherein the reflectance adjustment layer has a laminated structure in which the reflectance $R_y$ is decreased associated with temperature increase from the ambient temperature to the high temperature.

3. The Vertical Cavity Surface Emitting Laser according to claim 1, wherein the reflectance adjustment layer has a laminated structure in which a reduction rate associated with temperature increase from the ambient temperature to the high temperature of the reflectance $R_y$ is larger than a reduction rate associated with temperature increase from the ambient temperature to the high temperature of the reflectance $R_x$.

4. The Vertical Cavity Surface Emitting Laser according to claim 1, wherein the reflectance adjustment layer has a third multilayer film reflector, in a region opposed to the outer edge region of the light emission region, and has an aperture, in a region opposed to the central region of the light emission region, the third multilayer film reflector in which reflectance in a given wavelength range is decreased as the wavelength is longer, the given wavelength range including the oscillation wavelength $\lambda$, and light emission wavelength $\lambda_y$ ($<\lambda_x$) corresponding to bandgap of the active layer, and the aperture surrounded by the third multilayer film reflector.

5. The Vertical Cavity Surface Emitting Laser according to claim 1, wherein the reflectance adjustment layer has a third multilayer film reflector, at least in a whole region opposed to the light emission region, the third multilayer film reflector in which reflectance in a given wavelength range is decreased as the wavelength is longer, and the given wavelength range including the oscillation wavelength $\lambda_x$ and light emission wavelength $\lambda_y$ ($<\lambda_x$) corresponding to bandgap of the active layer, and the reflectance adjustment layer has a fourth multilayer film reflector on the third multilayer film reflector, the fourth multilayer film reflector in which, in a given wavelength, reflectance in a region opposed to the outer edge region of the light emission region is lower than reflectance in a region opposed to the central region of the light emission region, and the given wavelength being larger than oscillation wavelength $\lambda_1$ at 25 deg C.

6. The Vertical Cavity Surface Emitting Laser according to claim 1, wherein the active layer is made of a material with which difference $\Delta\lambda_a(=\lambda_1-\lambda_2)$ between oscillation wavelength $\lambda_1$ at 25 deg C. and light emission wavelength $\lambda_2$ corresponding to bandgap at 25 deg C. of the active layer is larger than difference $\Delta\lambda_m$ between the oscillation wavelength $\lambda_x$ and light emission wavelength $\lambda_y$ in the case of the maximum gain.

7. The Vertical Cavity Surface Emitting Laser according to claim 1, wherein the first multilayer film reflector has a structure in which a first low refractive index layer having a thickness of $\lambda_1/4n_1$ and a first high refractive index layer having a thickness of $\lambda_1/4n_2$ are alternately layered, and the second multilayer film reflector has a structure in which a second low refractive index layer having a thickness of $\lambda_1/4n_3$ and a second high refractive index layer having a thickness of $\lambda_1/4n_4$ are alternately layered, where $\lambda_1 > \lambda_2 + \Delta\lambda_m$, $\lambda_1$: oscillation wavelength at 25 deg C., $\lambda_2$: light emission wavelength corresponding to bandgap at 25 deg C. of the active layer, $\Delta\lambda_m$: difference between the oscillation wavelength $\lambda_x$ and the light emission wavelength $\lambda_y$ in the case of the maximum gain, $n_1$: refractive index of the first low refractive index layer, $n_2$: refractive index of the first high refractive index layer, $n_3$: refractive index of the second low refractive index layer, and $n_4$: refractive index of the second high refractive index layer.

8. The Vertical Cavity Surface Emitting Laser according to claim 4, wherein the third multilayer film reflector has a structure in which a third low refractive index layer having a thickness of $\lambda_1/4n_5$ and a third high refractive index layer having a thickness smaller than $\lambda_1/4n_6$ ($n_6$ is a refractive index) are alternately layered, where $\lambda_1 > \lambda_2 + \Delta\lambda_m$, $\lambda_1$: oscillation wavelength at 25 deg C., $\lambda_2$: light emission wavelength corresponding to the bandgap at 25 deg C. of the active layer, $\Delta\lambda_m$: difference between the oscillation wavelength $\lambda_x$ and the light emission wavelength $\lambda$ in the case of the maximum gain, $n_5$: refractive index of the third low refractive index layer, and $n_6$: refractive index of the third high refractive index layer.

9. The Vertical Cavity Surface Emitting Laser according to claim 5, wherein the fourth multilayer film reflector includes a first adjustment layer and a second adjustment layer in this order from the third multilayer film reflector side, in a region opposed to the central region of the light emission region, the first adjustment layer having a thickness of $(2k-1)\lambda_1/4n_7$ in which the refractive index $n_7$ has a value lower than a refractive index of the uppermost surface of the third multilayer film reflector, and the second adjustment layer having a thickness larger than $(2m-1)\lambda_1/4n_8$ in which the refractive index $n_8$ has a value higher than the refractive index $n_7$ of the first adjustment layer, and the fourth multilayer film reflector includes a third adjustment layer in a region opposed to the outer edge region of the light emission region, the third adjustment layer having a thickness larger than $(2n-1)\lambda_1/4n_9$ in which the refractive index $n_9$ has a value higher than the refractive index $n_7$ of the first adjustment layer, where $\lambda_1 > \lambda_2 + \Delta\lambda_m$, $\lambda_1$: oscillation wavelength at 25 deg C., $\lambda_2$: light emission wavelength corresponding to the bandgap at 25 deg C. of the active layer, $\Delta\lambda_m$: difference between the oscillation wavelength $\lambda_x$ and the light emission wavelength $\lambda_y$ in the case of the maximum gain, $n_7$: refractive index of the first adjustment layer, $n_8$: refractive index of the second adjustment layer, $n_9$: refractive index of the third adjustment layer, k: integer number of 1 or more, m: integer number of 1 or more, and n: integer number of 1 or more.

* * * * *